US011894474B2

(12) United States Patent
Dobriyal et al.

(10) Patent No.: US 11,894,474 B2
(45) Date of Patent: Feb. 6, 2024

(54) SILICON PHOTONIC INTEGRATED LENS COMPATIBLE WITH WAFER PROCESSING

(71) Applicant: Intel Corporation, Santa Clara, CA (US)

(72) Inventors: Priyanka Dobriyal, Milpitas, CA (US); Ankur Agrawal, Chandler, AZ (US); Susheel Jadhav, Chandler, AZ (US); Quan Tran, Fremont, CA (US); Raghuram Narayan, Newark, CA (US); Raiyomand Aspandiar, Portland, OR (US); Kenneth Brown, Tempe, AZ (US); John Heck, Berkeley, CA (US)

(73) Assignee: Intel Corporation, Santa Clara, CA (US)

( * ) Notice: Subject to any disclaimer, the term of this patent is extended or adjusted under 35 U.S.C. 154(b) by 1004 days.

(21) Appl. No.: 16/562,889

(22) Filed: Sep. 6, 2019

(65) Prior Publication Data

US 2021/0074866 A1   Mar. 11, 2021

(51) Int. Cl.
| | |
|---|---|
| *H01L 31/02* | (2006.01) |
| *H01L 31/0232* | (2014.01) |
| *G02B 3/00* | (2006.01) |
| *H01L 31/0216* | (2014.01) |
| *H01L 25/16* | (2023.01) |
| *H01L 31/18* | (2006.01) |
| *G02B 1/11* | (2015.01) |
| *G02B 6/42* | (2006.01) |
| *H01L 23/538* | (2006.01) |
| *G02B 6/24* | (2006.01) |

(52) U.S. Cl.
CPC .......... *H01L 31/02327* (2013.01); *G02B 1/11* (2013.01); *G02B 3/0012* (2013.01); *G02B 3/0056* (2013.01); *G02B 6/428* (2013.01); *H01L 23/5385* (2013.01); *H01L 25/167* (2013.01); *H01L 31/02005* (2013.01); *H01L 31/02019* (2013.01); *H01L 31/02161* (2013.01); *H01L 31/1876* (2013.01); *G02B 6/241* (2013.01)

(58) Field of Classification Search
CPC ...... G02B 6/428; G02B 6/241; G02B 3/0012; G02B 3/0056; G02B 1/11; H01L 31/02327; H01L 31/02005; H01L 31/02019; H01L 31/02161; H01L 31/1876; H01L 23/5385; H01L 25/167
USPC .......................................... 385/15
See application file for complete search history.

(56) References Cited

U.S. PATENT DOCUMENTS

| | | | |
|---|---|---|---|
| 2001/0018128 A1* | 8/2001 | Hannington | G02B 5/128 359/515 |
| 2017/0166753 A1* | 6/2017 | Slagter | C01B 32/26 |
| 2019/0123109 A1* | 4/2019 | Xie | H01L 27/305 |

* cited by examiner

*Primary Examiner* — Jerry M Blevins

(74) *Attorney, Agent, or Firm* — Schwabe, Williamson & Wyatt, P.C.

(57) ABSTRACT

Embodiments disclosed herein include optoelectronic systems and methods of forming such systems. In an embodiment the optoelectronic system comprises a board, and a carrier attached to the board. In an embodiment, a first die is on the carrier. In an embodiment, the first die is a photonics die, and a surface of the first die is covered by an optically transparent layer.

11 Claims, 8 Drawing Sheets

US 11,894,474 B2

SILICON PHOTONIC INTEGRATED LENS COMPATIBLE WITH WAFER PROCESSING

TECHNICAL FIELD

Embodiments of the present disclosure relate to semiconductor devices, and more particularly to integrated lenses in photonic dies that are compatible with wafer level processing.

BACKGROUND

Photonics dies may include integrated lenses in order to decrease losses in the system. The integrated lens may be formed by etching down into the substrate of the photonics die. For example, the backside surface of a silicon die may be etched in order to provide lens structures that are suitable for focusing light onto photodiodes.

However, the fabrication of lenses directly onto the die introduces significant manufacturing complexities. One such issue is that the backside surface of the die is no longer a substantially planar surface. Accordingly, handling the wafers on which the dies are manufactured becomes more complex, because vacuum handling can no longer be used. That is, the presence of the lens surfaces on the backside surface prevents a vacuum from being formed to secure the wafer.

As such, throughput reducing processes must be implemented in order to provide a wafer that is suitable for a high volume manufacturing (HVM) environment. For example, a tape or photoresist material may be disposed over the backside surface of the die in order to provide a planar surface suitable for vacuum handling. However, such materials need to be removed subsequent to wafer handling in order to expose the lens. This extra layer removal operation decreases the throughput for wafer processing and adds further complexities. For example, processes for avoiding the deposition of adhesive onto the lenses and/or processes for cleaning off all residue from the tape from the lenses is needed.

EMBODIMENTS OF THE PRESENT DISCLOSURE

Figure 1A:
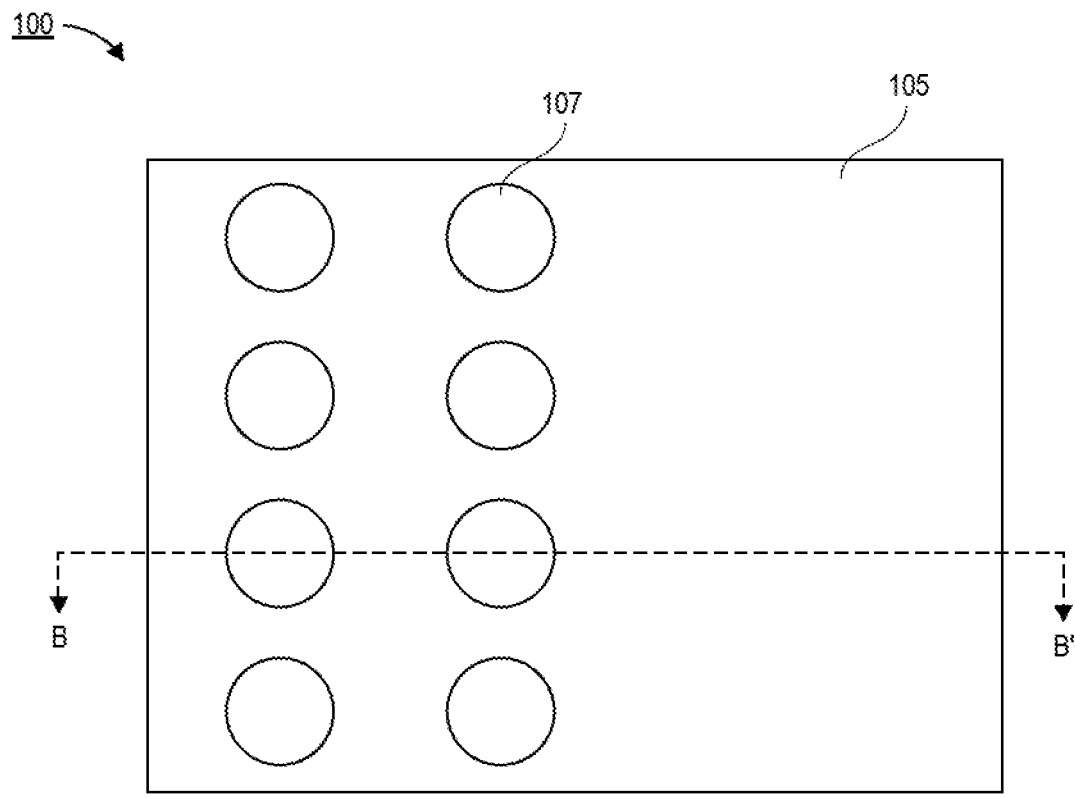
FIG. 1A is a plan view illustration of a semiconductor die with a plurality of lenses, in accordance with an embodiment.

Described herein are electronic packages that comprise integrated lenses in photonic dies that are compatible with wafer level processing, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, photonics dies with integrated lenses suffer from reduced throughput and issues with keeping the lenses completely clean. The reduced throughput is because the lenses generate a topography on the backside surface of the wafer that prevents the use of vacuum handling. Accordingly, additional processing operations are needed (e.g., deposition and the subsequent removal of layers used only during wafer level processing). Accordingly, embodiments disclosed herein include the application of an optically clear layer over the lenses. As used herein, "optically clear" may refer to a material that has a transmittance of a given wavelength (or range of wavelengths) that is approximately 80% or greater, approximately 90% or greater, approximately 95% or greater, or approximately 99% or greater.

In an embodiment, the optically clear layer is also a conformal layer. That is, the optically clear layer conforms to the topography of the backside surface of the wafer (including the topography of the lenses). The surface of the optically clear layer facing away from the wafer may be substantially planar. The planarity may be obtained during the deposition of the optically clear layer, or the planarity may be obtained using a polishing process (e.g., chemical-mechanical planarization CMP, etc.). In other embodiments, the planarity may be obtained by pressing the surface with a flat surface (e.g., using an embossing process) The planar surface allows for the wafer to be handled with a vacuum during wafer level handling. Furthermore, due to the optical properties of the layer, the optically clear layer does not need to be removed after singulation of the dies. That is, the final product may include the optically clear layer over the backside surface of the die (including over the surface of the lenses).

Figure 1B:
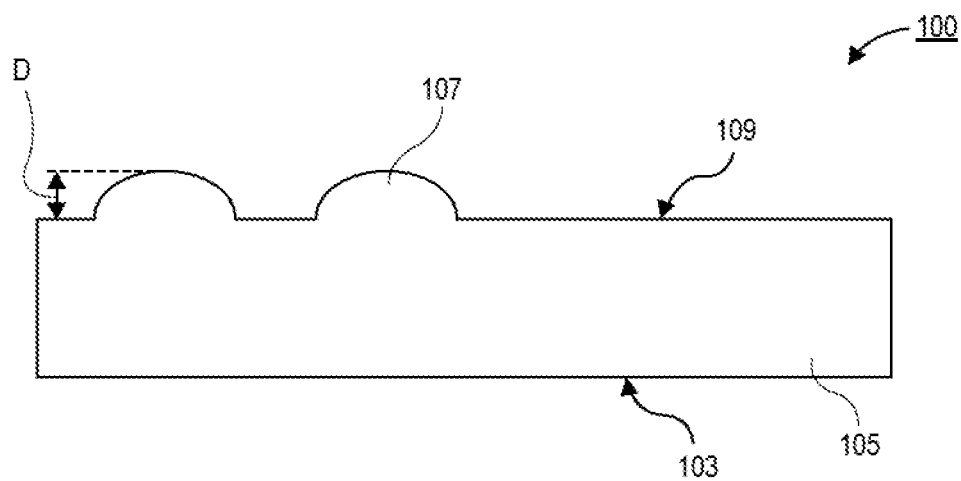
FIG. 1B is a cross-sectional illustration of the semiconductor die in FIG. 1A along line B-B', in accordance with an embodiment.

Referring now to FIGS. 1A and 1B, a plan view illustration of a photonics die 100 and a corresponding cross-sectional illustration of the photonics die 100 along line B-B' are shown, respectively, in accordance with an embodiment. In an embodiment, the photonics die 100 may be part of a receive line (Rx) of an optoelectronic system. That is, the photonics die 100 may receive optical inputs from an optical interconnect (e.g., a waveguide, a fiber optic cable, etc.) and convert the optical input into an electrical signal. In an embodiment, the photonics die 100 may comprise a substrate 105. The substrate 105 may be any suitable substrate for fabricating an Rx component of an optoelectronic system. In a particular embodiment, the substrate 105 may comprise silicon or another semiconductor material.

In an embodiment, the photonics die 100 may comprise a plurality of lenses 107 disposed over a portion of the substrate 105. In a particular embodiment, the lenses 107 are integral with the substrate 105. For example, as shown in FIG. 1B, the lenses 107 are homogenous with the substrate 105. The lenses 107 may be patterned into a first surface 109 of the substrate 105. Accordingly, the first surface 109 may comprise a non-planar topography. In an embodiment, the first surface 109 may sometimes be referred to as a backside surface of the photonics die 100. In an embodiment, the photonics die 100 may further comprise a second surface 103 that is opposite from the first surface 109. The second surface 103 may sometimes be referred to as a front-side surface of the photonics die 100.

In an embodiment, the plurality of lenses 107 may protrude up from the first surface 109 a distance D. The distance D is dependent on the needed focal point of the lenses 107. For example, the distance D may be between approximately 1 μm and 20 μm. In some embodiments, the distance D may be between 1 μm and 100 μm. In an embodiment, the distance D is sufficient to provide a topography that prevents the use of vacuum handling to carry a wafer from which the photonics die 100 is formed.

In the illustrated embodiment, the plurality of lenses 107 includes a set of eight lenses 107. However, it is to be appreciated that embodiments may include any number of lenses 107 (e.g., one or more lenses 107). Some embodiments may include tens of lenses 107 or hundreds of lenses 107. In an embodiment, the lenses 107 may be segregated to a particular region of the photonics die 100. For example, the lenses 107 in FIGS. 1A and 1B are arranged in two columns proximate to a left edge of the substrate 105. However, it is to be appreciated that the lenses 107 may be distributed across the substrate 105 in any suitable pattern or configuration.

Figure 2A:
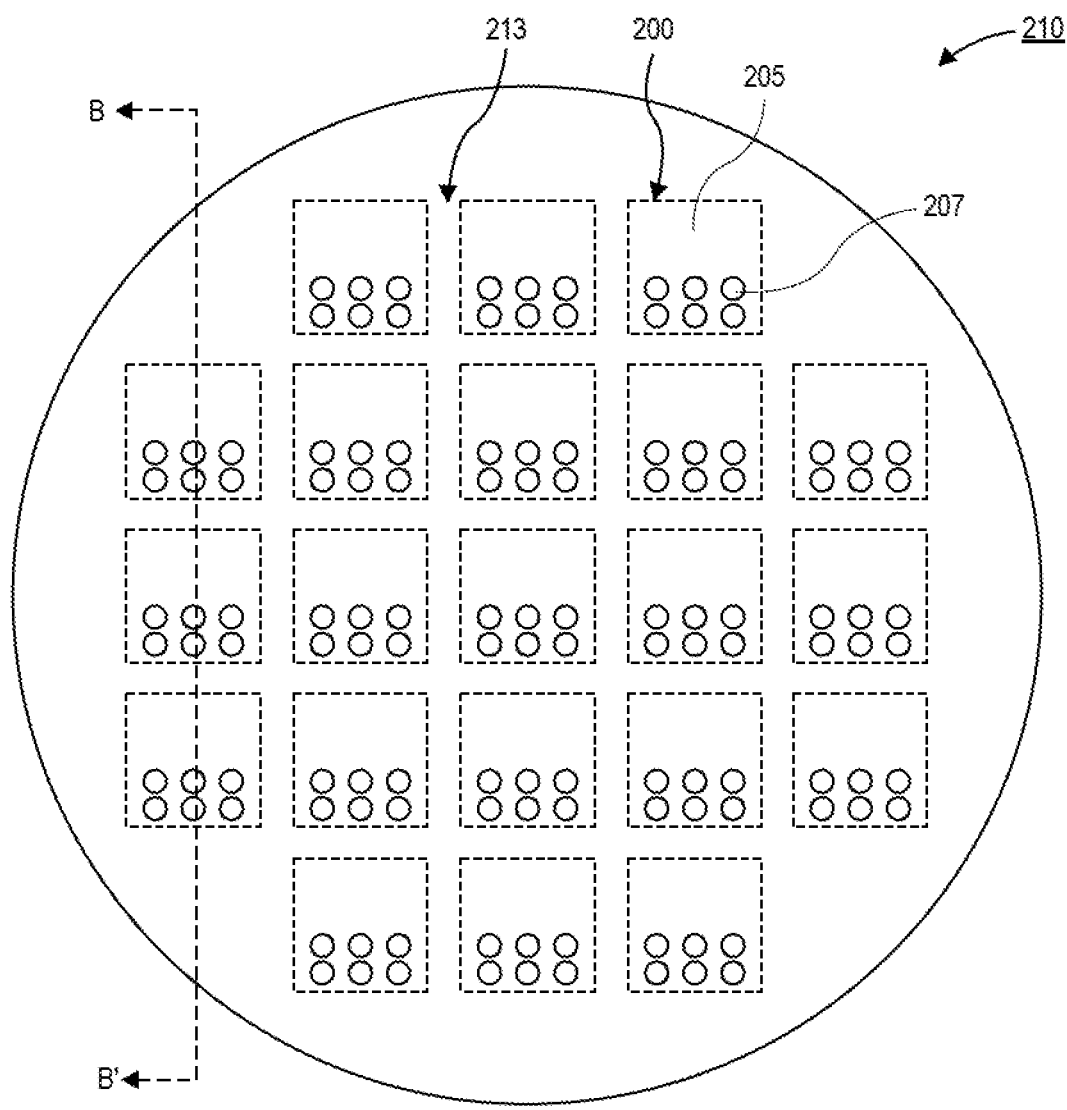
FIG. 2A is a plan view illustration of a wafer that comprises a plurality of dies with lenses, in accordance with an embodiment.

Referring now to FIG. 2A, a plan view illustration of a wafer 210 is shown, in accordance with an embodiment. In an embodiment, the wafer 210 comprises a plurality of photonics dies 200. While several photonics dies 200 are shown, it is to be appreciated that any number of photonics dies 200 (e.g., one or more photonics dies 200) may be formed on the wafer 210. For example, tens of photonics dies 200, hundreds of photonics dies 200, or thousands of photonics dies 200 may be formed on the wafer 210. In the illustrated embodiment, the individual photonics dies 200 are outlined with dashed lines to indicate that the substrates 205 of the photonics dies 200 are integral parts of the wafer 210. The dashed lines may indicate locations of scribe lines 213 (which are also sometimes referred to as saw streets). In an embodiment, the photonics dies 200 may also each comprise a plurality of lenses 207.

Figure 2B:
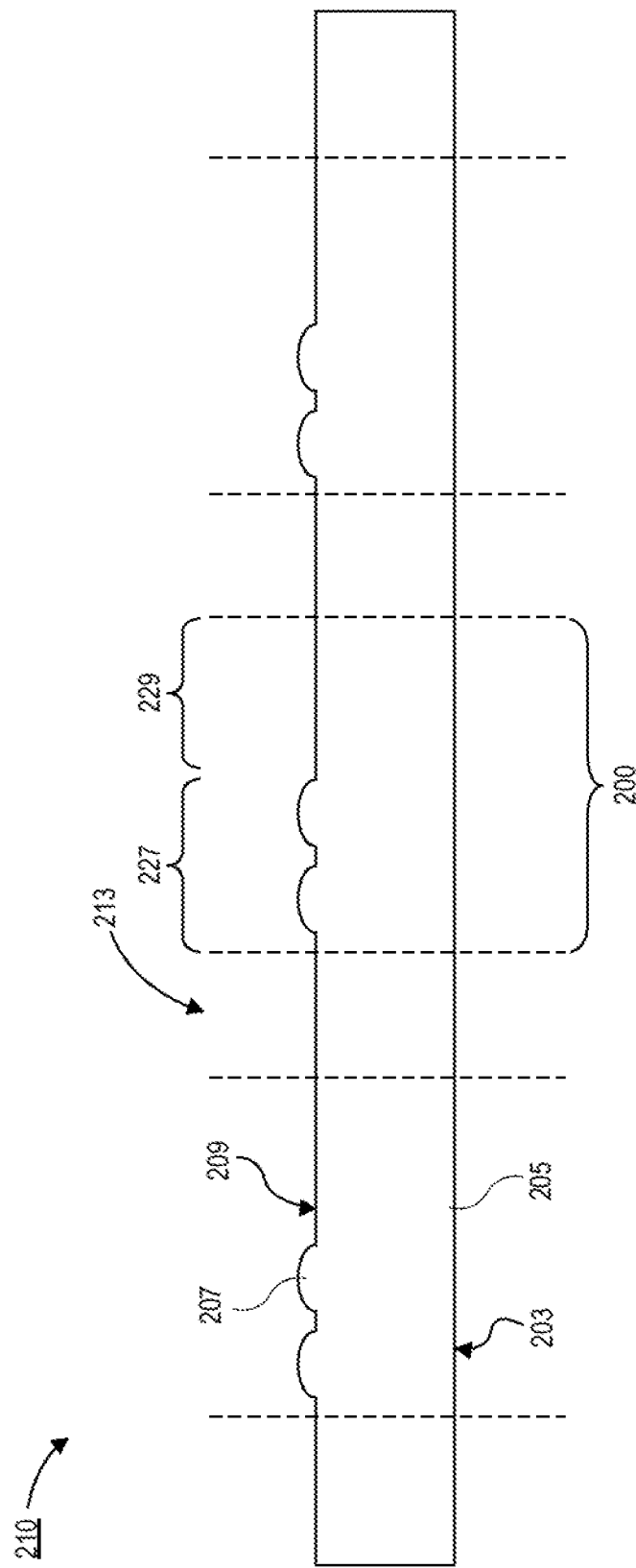
FIG. 2B is a cross-sectional illustration of the wafer in FIG. 2A along line B-B', in accordance with an embodiment.

Referring now to FIG. 2B, a cross-sectional illustration of the wafer 210 in FIG. 2A along line B-B' is shown, in accordance with an embodiment. As shown, each of the dies 200 are integral with the wafer 210, and each of the dies 200 are separated by a scribe line 213. Each of the dies 200 may comprise a first surface 209 and a second surface 203 opposite from the first surface 209. In an embodiment, the lenses 207 may protrude out from the first surface 209. Accordingly, the first surface 209 may have a topography that results in a non-planar surface. That is, the first surface 209 may not be substantially flat.

In an embodiment, the first surface 209 may be separated into regions. For example, a first region 227 may be referred to as a lens region 227. That is, the first region 227 may include the plurality of lenses 207. In an embodiment, a second region 229 may comprise a portion of the first surface 209 that is substantially flat. That is, the second region 229 may not include any of the plurality of lenses 207 in some embodiments. The separate regions 227, 229 may have different topographies. For example, the first region 227 may be substantially non-planar due to the plurality of lenses 207, and the second region 229 may be substantially planar (i.e., substantially flat). In an embodiment, the topography of the first region 227 prevents the use of vacuum based wafer handling of the wafer 210 since a consistent vacuum across the first surface 209 of the wafer 210 cannot be produced.

Figure 2C:
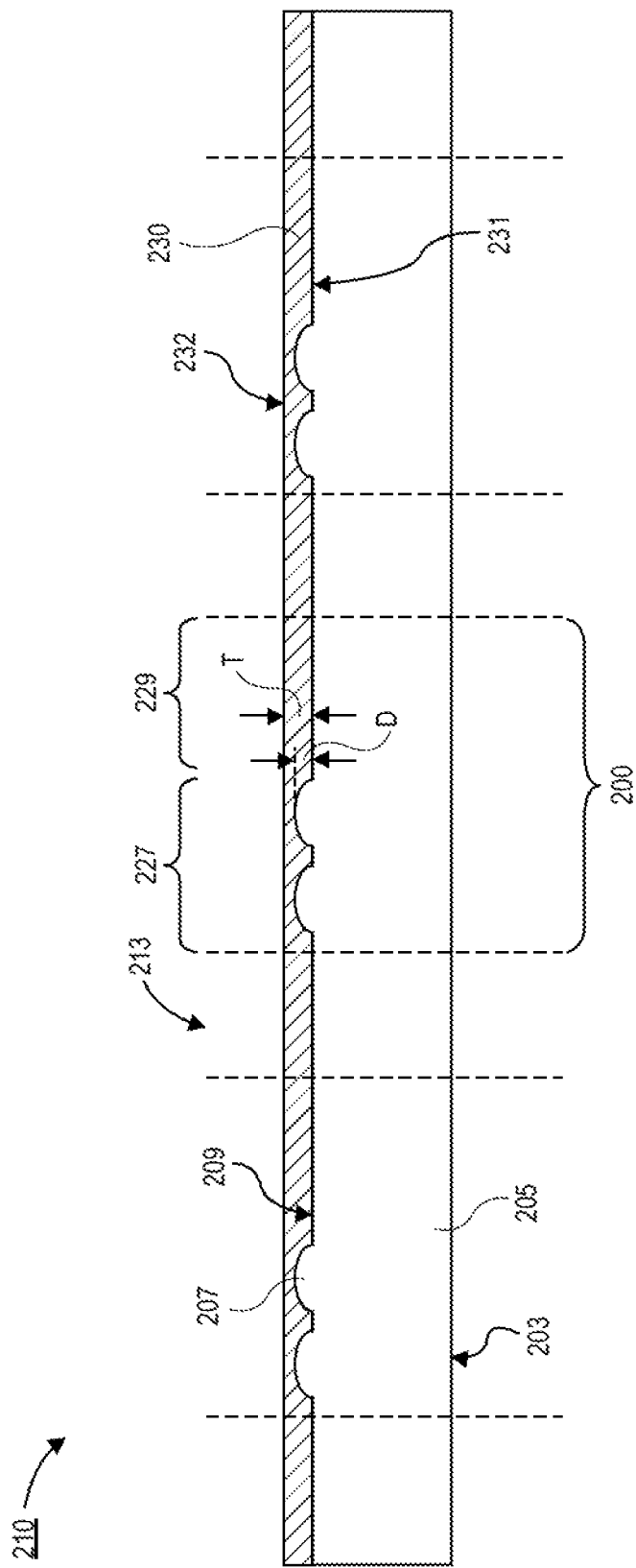
FIG. 2C is a cross-sectional illustration of the wafer after an optically clear layer is disposed over a backside surface of the wafer, in accordance with an embodiment.

Referring now to FIG. 2C, a cross-sectional illustration of the wafer 210 after an optically clear layer 230 is disposed over the first surface 209 of the wafer 210 is shown, in accordance with an embodiment. In an embodiment, the optically clear layer 230 is conformally disposed over the first surface 209. That is, the optically clear layer 230 is conformal to the topographies of the first region 227 and the second region 229. As such, a first surface 231 of the optically clear layer 230 is substantially non-planar in order to accommodate the curvature of the lenses 207 on each of the dies 200. However, a second surface 232 of the optically clear layer 230 remains substantially planar (i.e., substantially flat). As such, the second surface 232 of the optically clear layer 230 is suitable for providing a vacuum during wafer 210 handling.

In an embodiment, the optically clear layer 230 has a transmittance that is approximately 80% or higher, approximately 90% or higher, approximately 95% or higher, or approximately 99% or higher. The transmittance value may be for a desired wavelength of electromagnetic radiation, or the transmittance value may be an average transmittance value for a range of wavelengths of electromagnetic radiation. For example, the transmittance value may be an average transmittance value for electromagnetic radiation in the visible light spectrum.

In an embodiment, the optically clear layer 230 has a refractive index n that is close to the refractive index n of air (n=1). For example, the optically clear layer 230 may have a refractive index n that is less than approximately 2.0, less than approximately 1.75, or less than approximately 1.5. Closely matching the refractive index n of the optically clear layer 230 to that of air facilitates transparency characteristics of the optically clear layer 230.

In an embodiment, the optically clear layer 230 is also a material that has a relatively high melting temperature. A high melting temperature material is needed for the optically clear layer 230 in order to allow for subsequent processing to the wafer 210. For example, the melting temperature of the optically clear layer 230 may be approximately 300° C. or higher, approximately 400° C. or higher, or approximately 500° C. or higher. In an embodiment, the optically clear layer 230 further comprises relatively high mechanical strength (e.g., a relatively high modulus). For example, a modulus suitable for handling with a vacuum process is needed in order to prevent cracking, delamination, or other defects during processing.

In an embodiment, the optically clear layer 230 comprises an organic polymer. In a particular embodiment, the optically clear layer 230 comprises poly (para-xylylene), structural analogs thereof, or derivatives thereof. Such polymer materials can provide optically clear properties, with a refractive index n that is less than approximately 1.6. Such polymer materials may also provide high melting temperatures (e.g., $T_m$>500° C.). Such polymer materials also provide adequate mechanical properties (e.g., modulus, etc.), and can withstand vacuum environments.

In an embodiment, the optically clear layer 230 may be disposed over the wafer 210 with any suitable conformal deposition process. In a particular embodiment, the optically clear layer 230 may be deposited with a vapor phase deposition process. The use of a vapor phase deposition process of a polymeric material, such as those described above, allows for polymerization at the molecular level. Molecular level polymerization enables the conformal deposition along the first surface 209 and over the lenses 207. Other embodiments may include depositing the optically clear layer 230 with a spin-on process. In an embodiment, the second surface 232 of the optically clear layer 230 is substantially planar (i.e., flat) after deposition without further processing. In other embodiments, a polishing process (e.g., CMP) may be implemented subsequent to deposition of the optically clear layer 230 in order to provide a substantially planar (i.e., flat) second surface 232. In other embodiments, the planarity may be obtained by pressing the second surface 232 with a flat surface (e.g., using an embossing process)

In an embodiment, a maximum thickness T of the optically clear layer 230 may be greater than the distance D the lenses 207 protrude up from the first surface 209. Providing a maximum thickness T that is greater than the distance D ensures that the entire surface of each lens 207 is covered by the optically clear layer 230. In an embodiment, the maximum thickness T may be greater than the distance D by approximately 1 µm or more. In a particular embodiment, the thickness T may be approximately 50 µm or less, approximately 25 µm or less, approximately 10 µm or less, or 5 µm or less.

Figure 2D:
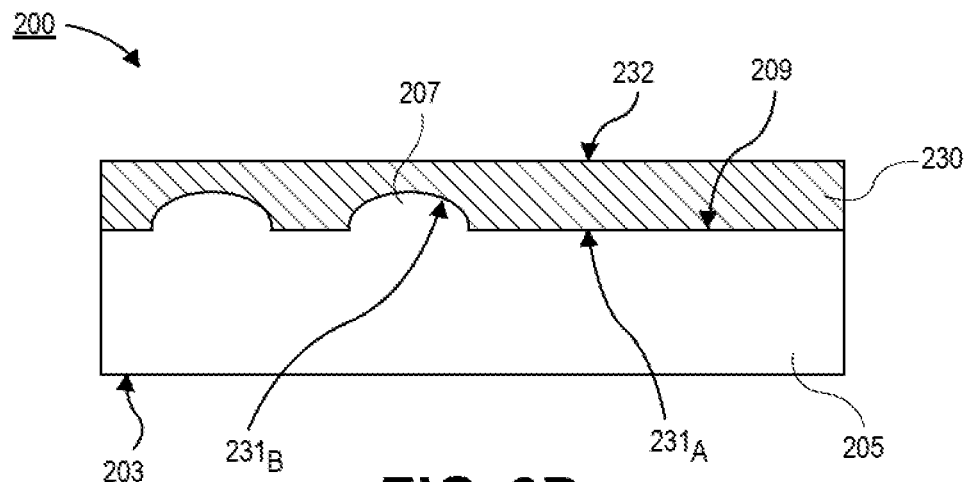
FIG. 2D is a cross-sectional illustration of a die that is singulated from the wafer in FIG. 2C, in accordance with an embodiment.

Referring now to FIG. 2D, a cross-sectional illustration of a die 200 that has been singulated from the wafer 210 in FIG. 2C is shown, in accordance with an embodiment. In an embodiment, the optically clear layer 230 is a material that can be singulated using standard processes used in coordination with the singulation of the substrate 205. That is, the optically clear layer 230 does not need to be removed or altered in order to singulate the dies 200 from the wafer 210. Accordingly, singulating the dies 200 from the wafer 210 results in the optically clear layer 230 remaining over the entire first surface 209. As illustrated, the first surface 231 of the optically clear layer 230 includes a first portion $231_A$ and a second portion $231_B$. The first portion $231_A$ is in contact with the planar portion of the first surface 209. The second portion $231_B$ is in contact with the non-planar lenses 207.

In FIG. 2D, the optically clear layer 230 is shown as being a single material layer. However, embodiments may include an optically clear layer 230 that includes more than one material layer. For example, the die 200 in FIG. 2E includes a multi-layered optically clear layer 230.

Figure 2E:
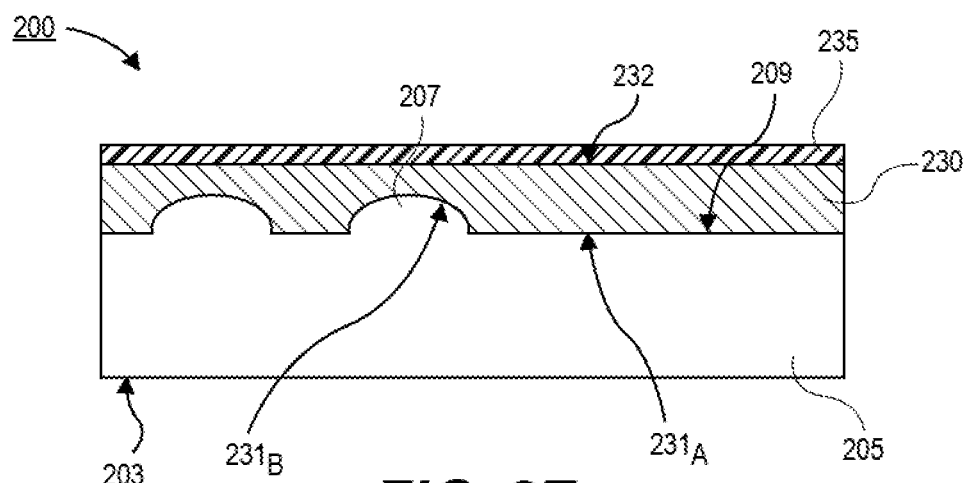
FIG. 2E is a cross-sectional illustration of a die that further comprises an antireflective coating over the optically clear layer, in accordance with an embodiment.

Referring now to FIG. 2E, a cross-sectional illustration of a singulated die 200 is shown, in accordance with an additional embodiment. In an embodiment, the die 200 may comprise a first optically clear layer 230 and a second optically clear layer 235 over the first optically clear layer 230. For example, the second optically clear layer 235 may be disposed over the second surface 232 of the first optically clear layer 230.

In an embodiment, the first optically clear layer 230 may be a different material than the second optically clear layer 235. For example, the second optically clear layer 235 may be a material with a refractive index n that is between the refractive index of air and the refractive index of the first optically clear layer 230. That is, the second optically clear layer 235 may provide a buffer between the first optically clear layer 230 and the air.

In a particular embodiment, the second optically clear layer 235 may be an antireflective coating (ARC). The use of an ARC may improve the efficiency of the system by decreasing the percentage of the light that is reflected away from the lens 207. In some embodiments, the ARC properties of the second optically clear layer 235 are provided by a single material layer. In other embodiments, the ARC properties of the second optically clear layer 235 are provided by a second optically clear layer 235 that comprises a plurality of distinct layers with different refractive indices n. Since the first optically clear layer 230 provides a flat second surface 232, the second optically clear layer 235 may comprise a material that is deposited with a non-conformal deposition process. Accordingly, the range of materials that may be selected for the second optically clear layer 235 is increased. In an embodiment, the second optically clear layer 235 may be disposed over the second surface 232 of the first optically clear layer 230 at the wafer level (i.e., before singulation). In other embodiments, the second optically clear layer 235 may be disposed over the second surface 232 of the first optically clear layer 230 at the die level (i.e., after singulation).

In an embodiment, the photonics dies 200 may be integrated into an optoelectronic system. In a particular embodiment, the photonics die 200 may be an optical-to-electrical conversion die. That is, an optical input signal is converted into an electrical signal by the photonics die 200. Such photonics dies 200 may be used in a receive chain (Rx) of a transceiver system. A portion (e.g., the Rx chain) of such an optoelectronic transceiver system is shown in FIG. 3A.

Figure 3A:
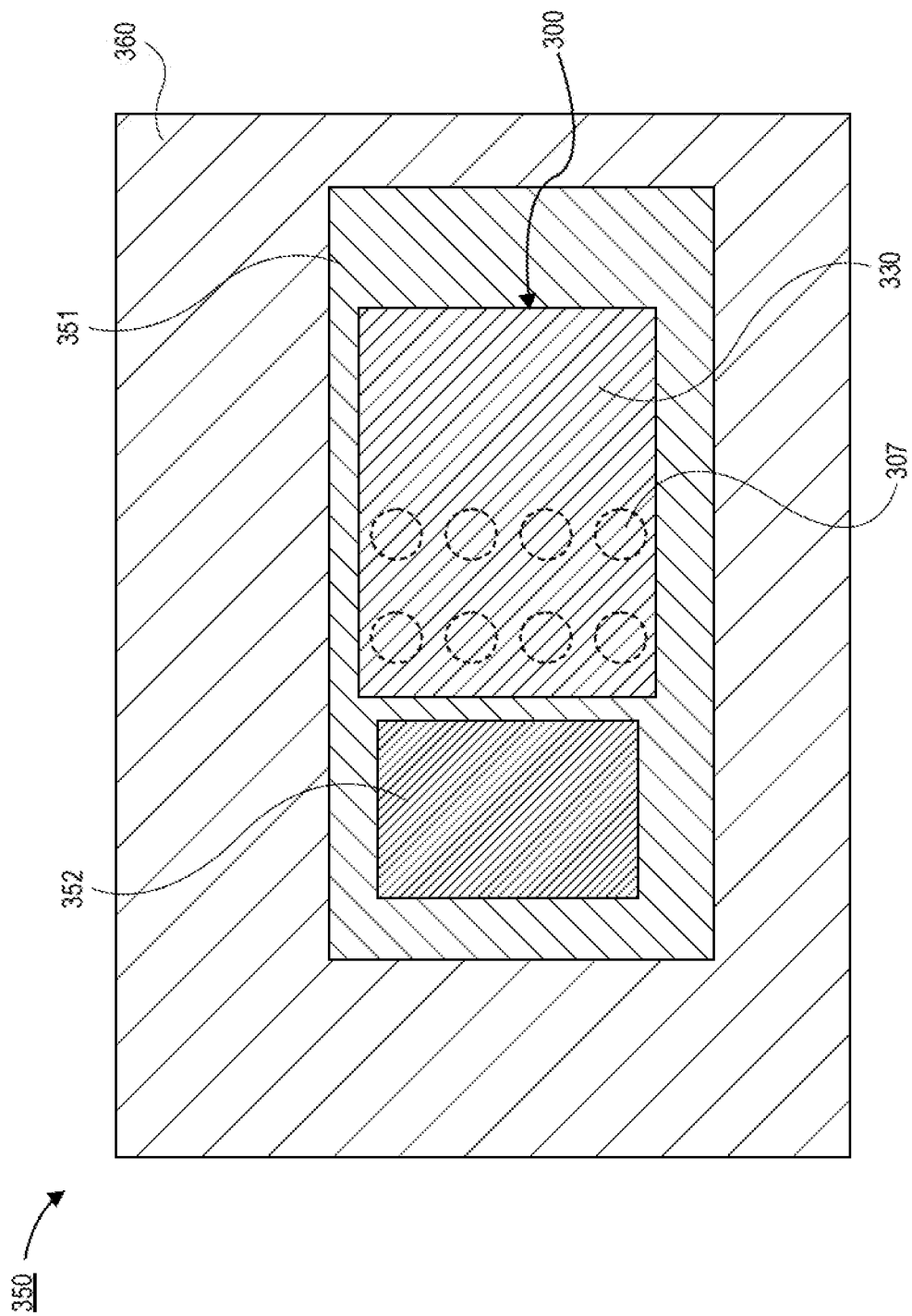
FIG. 3A is a plan view illustration of an optoelectronic system that comprises a photonics die with integrated lenses and an optically clear layer, in accordance with an embodiment.

Referring now to FIG. 3A, a plan view illustration of a portion of an optoelectronic system 350 is shown, in accordance with an embodiment. In an embodiment, the optoelectronic system 350 may comprise a board 360. The board 360 may be any suitable board, such as a printed circuit board (PCB) or the like.

In an embodiment, a carrier substrate 351 may be coupled to the board 360. The carrier substrate 351 may be any suitable material for carrying one or more dies or other components. In some embodiments, the carrier substrate 351 may be an interposer. The carrier substrate 351 may comprise a semiconductor material (e.g., silicon or the like). In an embodiment, the carrier substrate 351 comprises organic buildup layers typical of electronics packaging. In such embodiments, one or more bridge substrates (not shown) may be embedded in the carrier substrate 351 to provide high density interconnects between components. In other embodiments, the carrier substrate 351 may be a glass substrate.

In an embodiment, a plurality of components are attached to the carrier substrate 351. In the particular embodiment disclosed in FIG. 3A, a photonics die 300 and a companion die 352 to the photonics die 300 are attached to the carrier substrate 351. The photonics die 300 may be substantially similar to the dies 200 described above with respect to FIGS. 2A-2E. Particularly, the photonics die 300 may include a plurality of lenses 307 that are covered by an optically clear layer 330. As shown, the optically clear layer 330 covers the plurality of lenses 307 as well as covering an entire backside surface of the photonics die 300. The optically clear layer 330 may be any suitable optically clear layer that provides a planar surface that is compatible with high volume manufacturing vacuum handling of wafers. For example, the optically clear layer 330 may be similar to the optically clear layers 230 and 235 described above in FIGS. 2C-2E. In an embodiment, the companion die 352 may be a transimpedance amplifier (TIA).

Figure 3B:
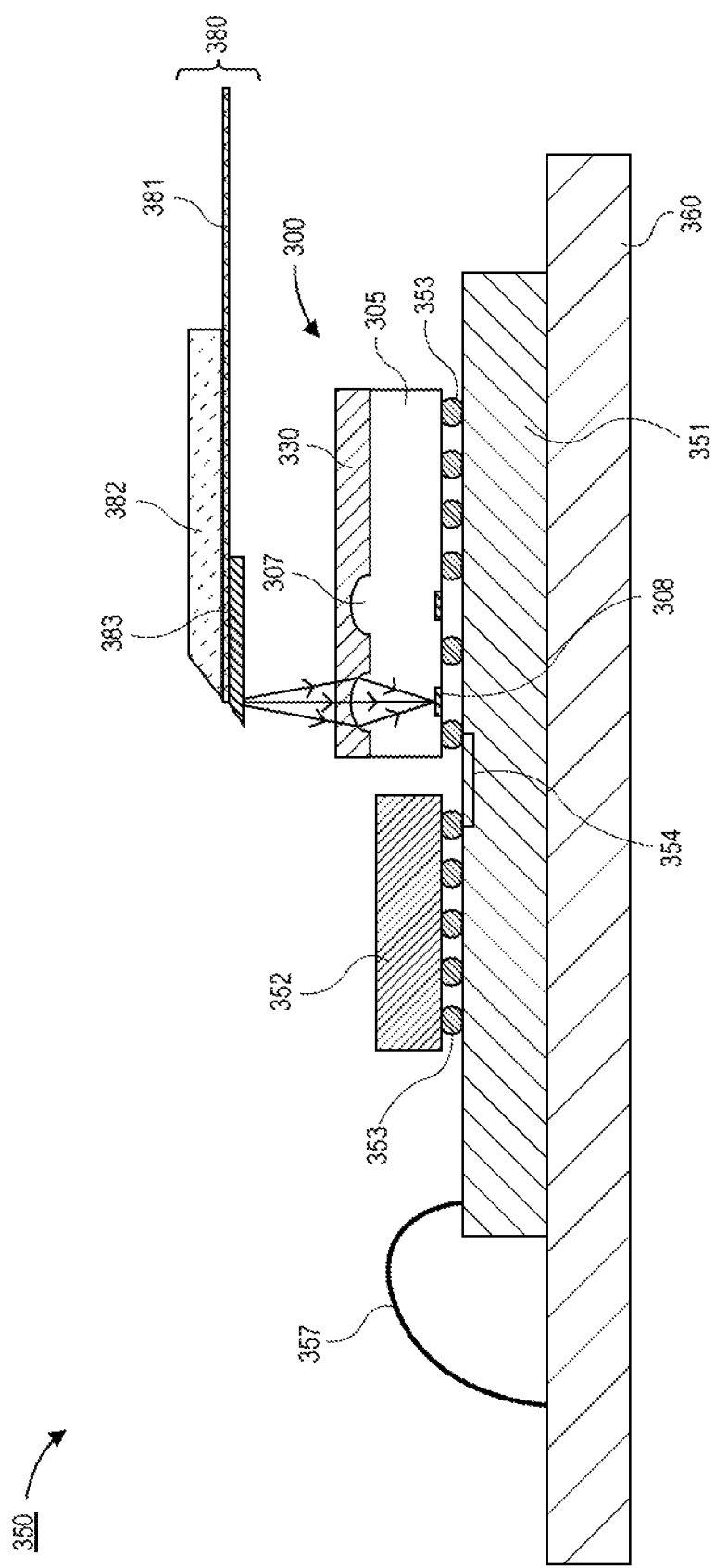
FIG. 3B is a cross-sectional illustration of the optoelectronic system in FIG. 3A and a fiber optic cable electrically coupled to the photonics die, in accordance with an embodiment.

Referring now to FIG. 3B, a cross-sectional illustration of a portion of an optoelectronic system 350 is shown, in accordance with an additional embodiment. The optoelectronic system 350 in FIG. 3B may be substantially similar to the optoelectronic system 350 in FIG. 3A, with the exception that an optical interconnect 380 is also shown.

The cross-sectional view in FIG. 3B more clearly illustrates some of the interconnect architectures that may be used to couple components together in the optoelectronic system 350. For example, interconnects 353 may be used to electrically couple the photonics die 300 and the companion die 352 to the carrier substrate 351. The interconnects 353 may be any suitable interconnect, such as solder balls or the like. In some embodiments, the interconnects 353 may be referred to as first level interconnects (FLIs). In an embodiment, a conductive path 354 through the carrier substrate 351 may electrically couple the photonics die 300 to the companion die 352. In the illustrated embodiment, the carrier substrate 351 is electrically coupled to the board 360 by wire bonds 357. However, it is to be appreciated that other interconnect architectures (e.g., sockets, solder balls, or other connectors) may be used to electrically couple the carrier substrate 351 to the board 360.

In an embodiment, the optical interconnect 380 is optically coupled to the photonics die 300. In an embodiment, the optical interconnect 380 comprises the termination 382 of an optical cable 381 (e.g., a fiber optic cable, or other waveguide structure). In some embodiments, a lid 383 may also be included in the optical interconnect 380. As shown by the ray tracings, optical wavelengths propagate towards one of the lenses 307. The lens 307 focuses the wavelengths towards an optical-to-electrical component 308 embedded in the substrate 305. For example, the optical-to-electrical component 308 may comprise photodetector which converts light into electricity using the photoelectric effect. In an embodiment, the combination of the photodetector optical-to-electric component 308 and the TIA companion die 352 may produce a digital signal in the electrical domain from the incoming optical signal.

In FIG. 3B, a single optical interconnect 380 is shown. However, it is to be appreciated that an array of optical interconnects 380 may be used to provide increased bandwidth. For example, each of the lenses 307 of the photonics die 300 may be optically coupled to a different one of the optical interconnects 380 in an array.

It is to be appreciated that only a portion of the Rx chain of the optoelectronic system 350 is shown in FIGS. 3A and 3B. Embodiments may also include an optoelectronic system 350 that includes a transmit chain (Tx). Additionally, further signal processing may be implemented by additional filters, amplifiers, and/or other components that are coupled to the carrier substrate 351 and/or the board 360.

Figure 4:
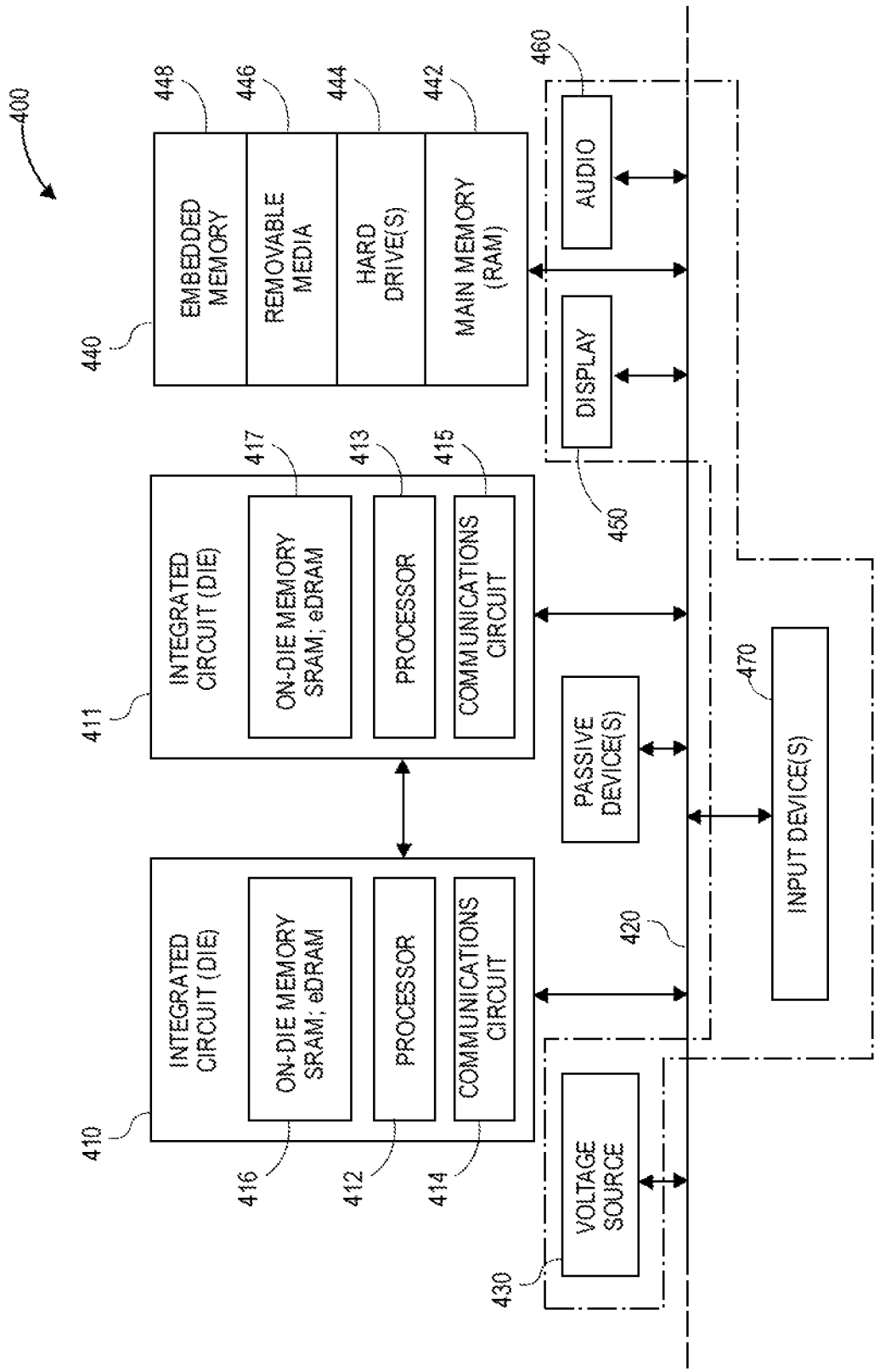
FIG. 4 is a schematic of a computing device built in accordance with an embodiment.

FIG. 4 illustrates a schematic of computer system 400 according to an embodiment. The computer system 400 (also referred to as an electronic system 400) can include a semiconductor package comprising a photonics die with integrated lenses that are covered by an optically clear layer in accordance with any of the embodiments and their equivalents as set forth in this disclosure. The computer system 400 may be a mobile device, a netbook computer, a wireless smart phone, a desktop computer, a hand held reader, a server system, a supercomputer, or a high-performance computing system.

The electronic system 400 can be a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In one embodiment, the voltage source 430 supplies current to the integrated circuit 410 through the system bus 420.

The integrated circuit 410 is electrically coupled to the system bus 420 and includes any circuit, or combination of circuits according to an embodiment. In an embodiment, the integrated circuit 410 includes a processor 412. As used herein, the processor 412 may mean any type of circuit such as, but not limited to, a microprocessor, a microcontroller, a graphics processor, a digital signal processor, or another processor. In an embodiment, the processor 412 includes, or is coupled with, a semiconductor package comprising a photonics die with integrated lenses that are covered by an optically clear layer in accordance with any of the embodiments and their equivalents, as described in the foregoing specification. In an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems, or a communications circuit for servers. In an embodiment the communications circuit 414 may comprise a photonics die with integrated lenses that are covered by an optically clear layer. In an embodiment, the integrated circuit 410 includes on-die memory 416 such as static random-access memory (SRAM). In an embodiment, the integrated circuit 410 includes embedded on-die memory 416 such as embedded dynamic random-access memory (eDRAIVI). In one embodiment, the on-die memory 416 may be packaged with a process in accordance with any of the embodiments and their equivalents, as described in the foregoing specification.

In an embodiment, the integrated circuit 410 is complemented with a subsequent integrated circuit 411. Useful embodiments include a dual processor 413 and a dual communications circuit 415 and dual on-die memory 417 such as SRAM. In an embodiment, the dual integrated circuit 410 includes embedded on-die memory 417 such as eDRAM.

In an embodiment, the electronic system 400 also includes an external memory 440 that may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448 such as the first die in a die stack, according to an embodiment.

In an embodiment, the electronic system 400 also includes a display device 450 and an audio output 460. In an embodiment, the electronic system 400 includes an input device such as a controller 470 that may be a keyboard, mouse, trackball, game controller, microphone, voice recognition device, or any other input device that inputs information into the electronic system 400. In an embodiment, an input device 470 is a camera. In an embodiment, an input device 470 is a digital sound recorder. In an embodiment, an input device 470 is a camera and a digital sound recorder.

The above description of illustrated implementations of the invention, including what is described in the Abstract, is not intended to be exhaustive or to limit the invention to the precise forms disclosed. While specific implementations of, and examples for, the invention is described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor die, comprising: a semiconductor substrate having a first surface and a second surface; a lens over the first surface; and an optically transparent layer over the lens.

Example 2: semiconductor die of Example 1, wherein the optically transparent layer is over the entire first surface.

Example 3: the semiconductor die of Example 2, wherein a first surface of the optically transparent layer is conformal to a surface of the lens and to the first surface of the semiconductor substrate, and wherein a second surface of the optically transparent layer is substantially flat.

Example 4: the semiconductor die of Examples 1-3, wherein a maximum thickness of the optically transparent layer is approximately 100 µm or less.

Example 5: the semiconductor die of Example 4, wherein the maximum thickness of the optically transparent layer is approximately 20 µm or less.

Example 6: the semiconductor die of Examples 1-5, further comprising: a plurality of lenses over the first surface.

Example 7: the semiconductor die of Example 6, wherein the optically transparent layer covers each lens of the plurality of lenses.

Example 8: the semiconductor die of Examples 1-7, wherein the optically transparent layer comprises a polymer.

Example 9: the semiconductor die of Example 8, wherein the optically transparent layer comprises poly (para-xylylene) or structural analogs thereof.

Example 10: the semiconductor die of Examples 1-9 further comprising: an antireflective coating over the optically transparent layer.

Example 11: the semiconductor die of Examples 1-10, wherein the lens is part of the semiconductor substrate.

Example 12: the semiconductor die of Examples 1-11, wherein the semiconductor substrate is a silicon substrate.

Example 13: the semiconductor die of Examples 1-12, wherein the semiconductor die is a photonics die.

Example 14: an optoelectronic system, comprising: a board; a carrier attached to the board; and a first die on the carrier, wherein the first die is a photonics die, and wherein a surface of the first die is covered by an optically transparent layer.

Example 15: the optoelectronic system of Example 14, wherein the first die comprises: a lens, wherein the lens is integrated into a substrate of the first die.

Example 16: the optoelectronic system of Example 15, wherein the lens is covered by the optically transparent layer.

Example 17: the optoelectronic system of Examples 14-16, wherein a first surface of the optically transparent layer that faces away from the first die is substantially flat.

Example 18: the optoelectronic system of Example 17, wherein a second surface of the optically transparent layer that faces towards the first die is conformal to the surface of the first die.

Example 19: the optoelectronic system of Examples 14-18, further comprising: a second die on the carrier, wherein the second die is electrically coupled to the first die by an interconnect on the carrier.

Example 20: the optoelectronic system of Examples 14-19, wherein the carrier is electrically coupled to the board by a wire bond.

Example 21: the optoelectronic system of Examples 14-20, further comprising: a fiber optic cable optically coupled to the first die.

Example 22: the optoelectronic system of Examples 14-21, further comprising: an antireflective coating over the optically transparent layer.

Example 23: a method of forming a photonics die, comprising: fabricating a plurality of photonics dies on a wafer; forming a plurality of lenses on each of the photonics dies, wherein the plurality of lenses provide a non-planar surface across the wafer; disposing an optically clear layer over the non-planar surface, wherein the optically clear layer has a first surface that is conformal to the non-planar surface across the wafer and a second surface facing away from the wafer that is substantially flat; and singulating the plurality of photonics dies.

Example 24: the method of Example 23, wherein the optically clear layer is disposed with a vapor phase deposition process or a spin-on process.

Example 25: the method of Example 23 or Example 24, wherein the second surface is made flat with a chemical mechanical polishing (CMP) process or an embossing process.

What is claimed is:

1. A semiconductor die, comprising:
   a semiconductor substrate having a first surface and a second surface;
   a first lens and a second lens over the first surface, the second lens laterally spaced apart from the first lens; and
   an optically transparent layer over the first lens and the second lens, wherein a first surface of the optically transparent layer is conformal to a surface of the first lens and the second lens and to the first surface of the semiconductor substrate, and wherein a second surface of the optically transparent layer is substantially flat over the first lens and the second lens and between the first lens and the second lens, the second surface opposite the first surface.

2. The semiconductor die of claim 1, wherein the optically transparent layer is over the entire first surface.

3. The semiconductor die of claim 1, wherein a maximum thickness of the optically transparent layer is approximately 100 µm or less.

4. The semiconductor die of claim 3, wherein the maximum thickness of the optically transparent layer is approximately 20 μm or less.

5. The semiconductor die of claim 1, wherein the optically transparent layer comprises a polymer.

6. The semiconductor die of claim 5, wherein the optically transparent layer comprises poly (para-xylylene) or structural analogs thereof.

7. The semiconductor die of claim 1, further comprising:
an antireflective coating over the optically transparent layer.

8. The semiconductor die of claim 1, wherein the first lens and the second lens are part of the semiconductor substrate.

9. The semiconductor die of claim 1, wherein the semiconductor substrate is a silicon substrate.

10. The semiconductor die of claim 1, wherein the semiconductor die is a photonics die.

11. A semiconductor die, comprising:
a semiconductor substrate having a first surface and a second surface;
a lens over the first surface; and
an optically transparent layer over the lens, wherein the optically transparent layer comprises a polymer comprising poly (para-xylylene) or structural analogs thereof.

* * * * *